(12) United States Patent
DelPrete et al.

(10) Patent No.: US 6,669,490 B1
(45) Date of Patent: Dec. 30, 2003

(54) CONDUCTIVE ELASTOMERIC CONTACT SYSTEM WITH ANTI-OVERSTRESS COLUMNS

(75) Inventors: Stephen D. DelPrete, Rehoboth, MA (US); Peter D. Wapenski, Foster, RI (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/315,298

(22) Filed: Dec. 10, 2002

(51) Int. Cl.[7] .................................................. H01R 4/58
(52) U.S. Cl. .............................. 439/86; 439/66; 439/91
(58) Field of Search .............................. 439/86, 91, 66, 439/591

(56) References Cited

U.S. PATENT DOCUMENTS 5,397,240 A * 3/1995 Herard ........................ 439/66
5,474,458 A * 12/1995 Vafi et al. ..................... 439/91
5,599,193 A * 2/1997 Crotzer ........................ 439/66
6,394,821 B1 * 5/2002 Matsumura et al. .......... 439/91
6,416,331 B1 * 7/2002 Shimizu ...................... 439/66

* cited by examiner

Primary Examiner—Tho D. Ta

(57) ABSTRACT

A connector for board-to-board and board to device interconnect applications includes a plurality of conductive elastomeric columnar contacts surrounded by respective insulative support columns. The elastomeric columnar contacts extend through holes in an insulative subtrate. The insulative support columns have opposing end surfaces disposed on opposite sides of a substrate and end surfaces of the columnar contacts are located at a distance from the substrate slightly greater than the distance between the substrate and the support column end surfaces. Insulative intermediate columns serve a mechanical stops that resist further compression of the elastomeric contacts and the support columns when the connector is subjected to excessive axial compressive forces. The intermediate columns have opposing end surfaces on opposing sides of the substrate that are spaced from the substrate a distance less than the support column end surfaces.

13 Claims, 4 Drawing Sheets

CONDUCTIVE ELASTOMERIC CONTACT SYSTEM WITH ANTI-OVERSTRESS COLUMNS

CROSS REFERENCE TO RELATED APPLICATIONS n/a

STATEMENT REGARDING FEDERALLY SPONSORED RESEARCH OR DEVELOPMENT n/a

BACKGROUND OF THE INVENTION

The present invention relates to connectors and more specifically to an interconnect system that utilizes conductive elastomeric columnar contacts to achieve conductive interconnection between opposing arrays of conductive contact pads.

Interconnect devices using elastomeric conductive members are known. One such interconnect device is disclosed in U.S. Pat. No. 6,056,557. In this interconnect device, conductive resilient members are disposed in holes in a substrate on a predetermined grid array and the assembly is positioned between adjacent printed circuit boards so as to make conductive contact between conductive pads on opposing boards.

Other connectors employing conductive elastomeric columns are disclosed in U.S. Pat. Nos. 5,599,193, 5,624,268, 6,271,482 and 6,348,659.

In board to device interconnect applications, such as board to Land Grid Array (LGA) or Ball Grid Array (BGA) devices it is important to maintain accurate positioning of the respective columnar contacts while avoiding distortion of the conductive elements that can result from the application of axial compressive forces to the contacts of the connector.

Accordingly, it would be desirable to have a connector system that employs conductive elastomeric columnar contacts that permit board to board or board to device interconnections and that maintain accurate alignment of the contacts in a predetermined array pattern. It would further be desirable for the contact positioning and shape to be resistant to distortion due to applied compressive forces that might adversely affect either the conductivity or positional accuracy of the contacts.

BRIEF SUMMARY OF THE INVENTION

A connector for use in interconnect applications comprises a plurality of conductive elastomeric columnar contacts retained in an insulating substrate and arranged in a predetermined pattern. The elastomeric columnar contacts are each surrounded by a support column molded of an insulative polymer, such as silicone. In one embodiment, the support columns have a generally cylindral outer surface. The support columns provide mechanical support for and tend to reduce the deformation of the conductive elastomeric columnar contacts when the columnar contacts are subjected to compressive axial forces. Additionally, intermediate columns are formed between at least some of the support columns. The intermediate columns serve as mechanical stops and resist further compression of the connector in response to the application of excessive axial compressive forces to the contacts and the support columns. The location of the intermediate columns corresponds to the location of injection ports used in the molding of the intermediate columns and the support columns. Passageways are provided in the mold that allow for the flow of material from the point of injection at the respective intermediate column to one or more adjacent support columns. Insulative bridges are thus formed between the intermediate columns and the support columns in the location of such passageways. The height of the bridges above the substrate is equal to or less than the height of the intermediate columns above the substrate.

In one embodiment of the invention, a plurality of conductive elastomeric columnar contacts are supported by and retained in a substrate, such as a polyimide sheet, to form a contact assembly. The contact assembly is positioned within in a mold and an insulative polymer, such as silicon, is injected into the mold to form the support columns and the intermediate columns. The columnar contacts have opposing tips that protrude slightly beyond the respective opposing end surfaces of the support columns to allow the tips of the columnar contacts to make conductive contact with corresponding pads located on printed circuit boards, an LGA device or a BGA device, as applicable. The height of the end surfaces of the intermediate columns is specified to serve as a mechanical stop so as to resist further compression of the connector in response to the application of excessive axial compressive forces on the contacts and the support columns.

A connector in accordance with the present invention may be produced by molding the conductive elastomeric columnar contacts in a first molding operation and by molding the support columns, the intermediate columns and the insulative bridges as an integral structure in a second molding operation.

Other features, aspects and advantages of the above described connector and methods of making the same will be apparent to those of ordinary skill in the art from the detailed description of the invention that follows.

BRIEF DESCRIPTION OF THE SEVERAL VIEWS OF THE DRAWING

The invention will be more fully understood by reference to the following Detailed Description of the Invention in conjunction with the drawing of which.

DETAILED DESCRIPTION OF THE INVENTION

Figure 1:
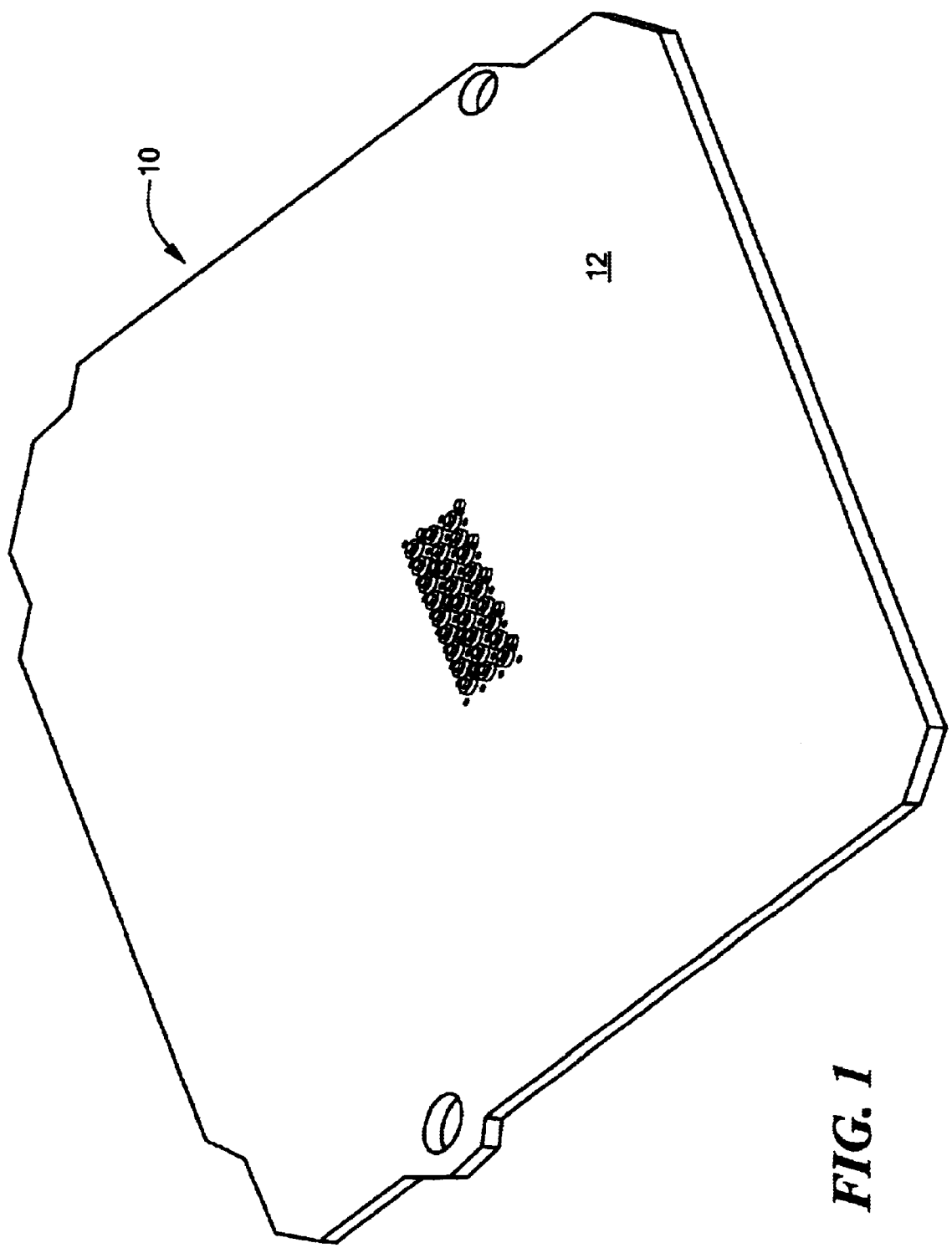
FIG. 1 is a perspective view of a connector in accordance with the present invention.
Figure 2:
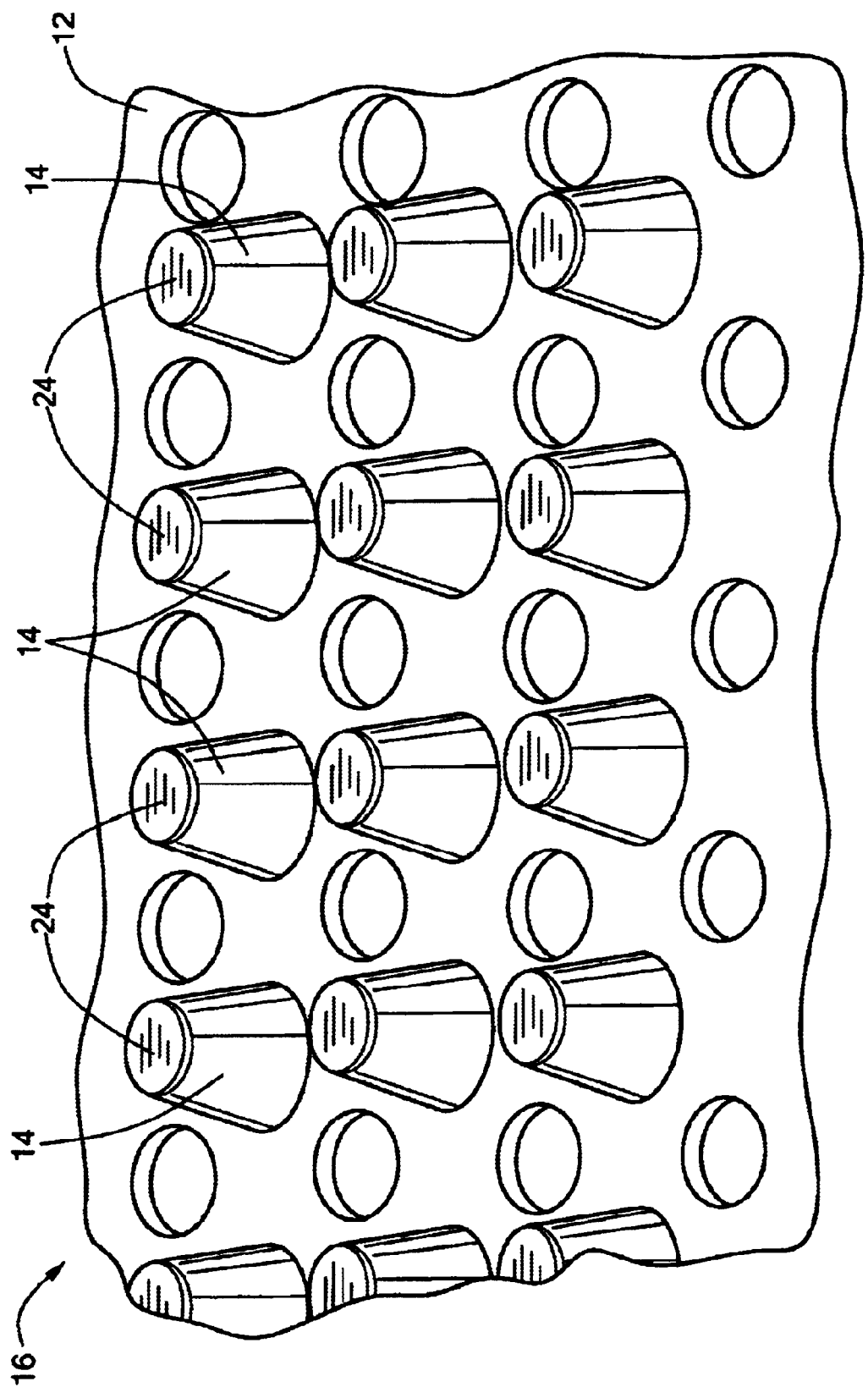
FIG. 2 is a perspective view of a contact assembly employed in the connector of FIG. 1.
Figure 3:
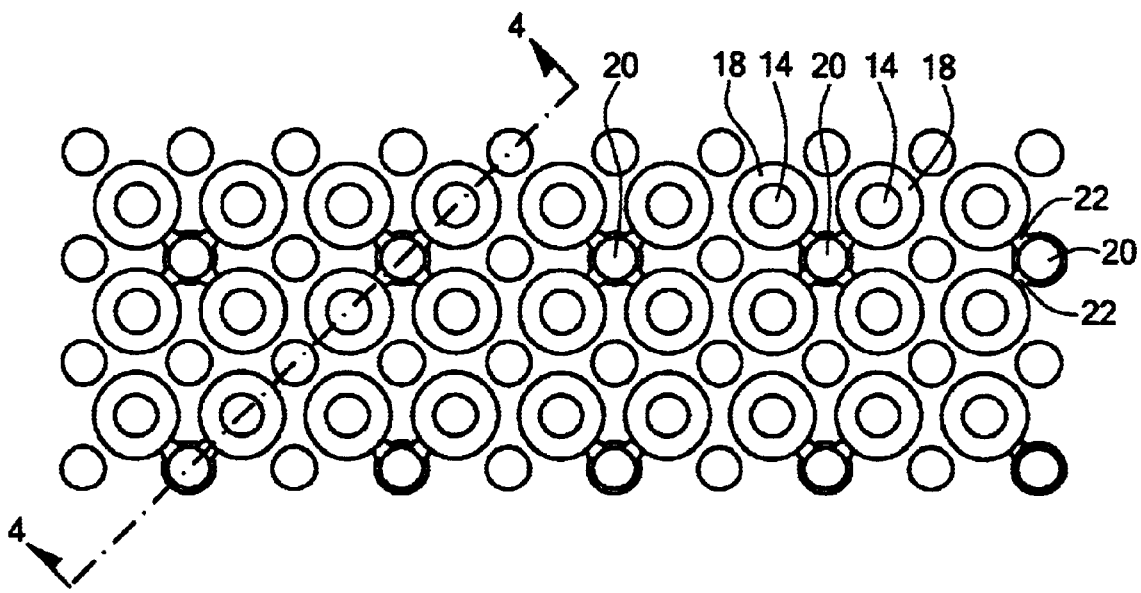
FIG. 3 is a top plan view of the connector of FIG. 1.
Figure 4:
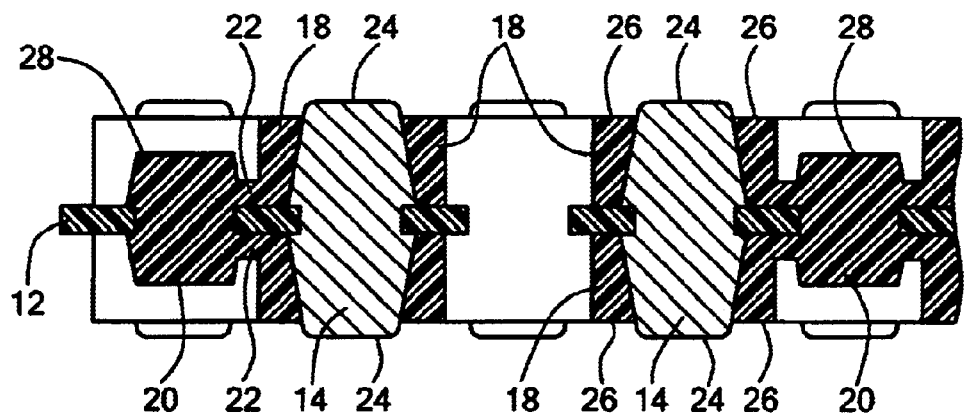
FIG. 4 is a cross-sectional view of the connector of FIG. 3 along a portion of section ZZ.
Figure 5:
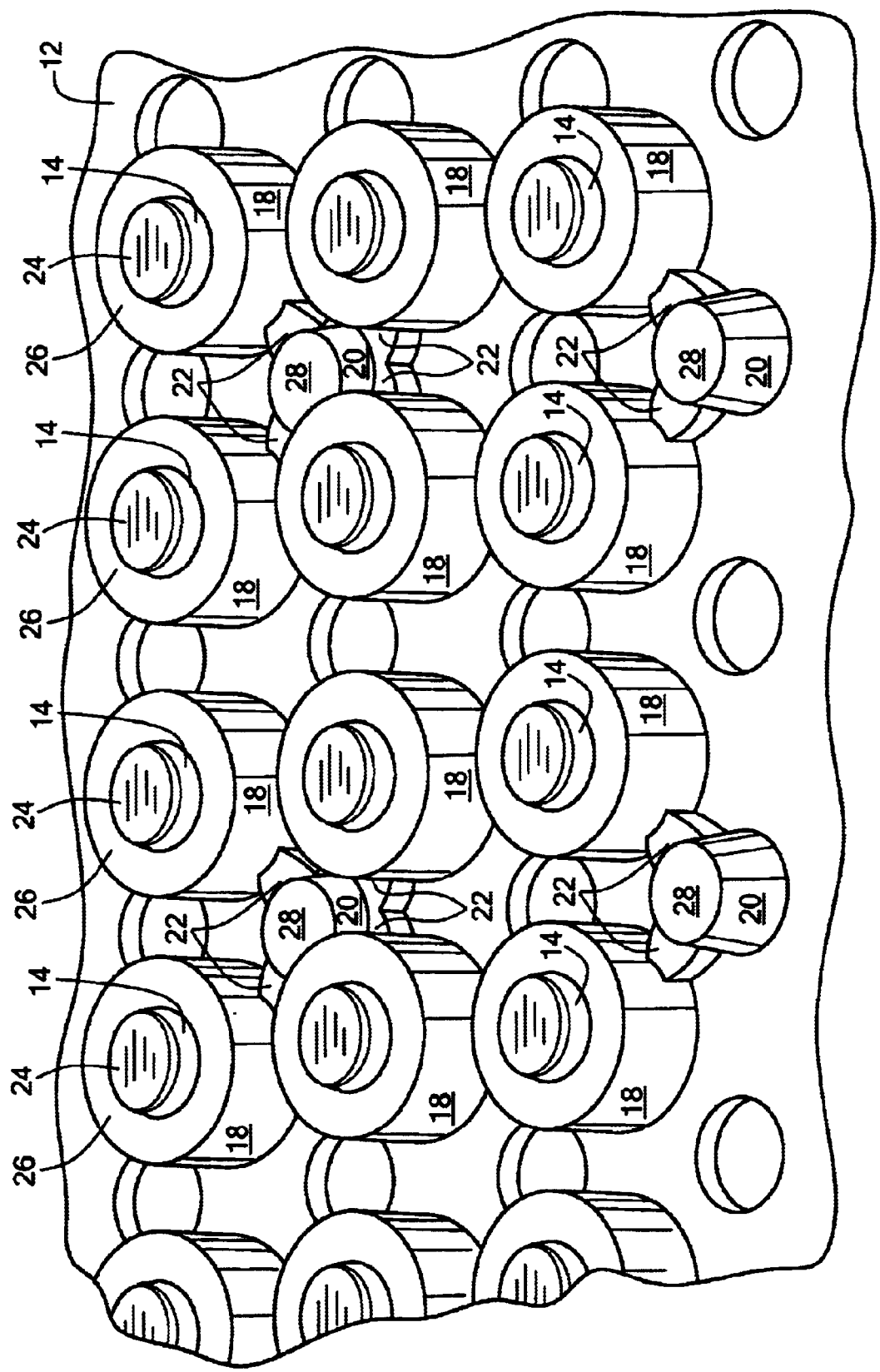
FIG. 5 is perspective view of an enlarged portion of the connector depicted in FIG. 2.

A connector for making a board-to-board or board to device electrical interconnection and a method for making the connector is disclosed. Referring to FIGS. 1–5, the connector 10 includes an insulative substrate 12 such as a polyimide sheet (e.g. Kapton™), and a plurality of conductive elastomeric columnar contacts 14 retained within the substrate 12. The columnar contacts 14 and the substrate 12 form a contact assembly 16 that is subsequently discussed in greater detail. The connector 10 includes generally cylindrical insulative support columns 18 that surround and abut the columnar contacts 14. Additionally the connector 10 includes insulative intermediate columns 20. Each of the intermediate columns 20 is disposed adjacent to selected group of one or more support columns 18. Each support column 18 surrounds a single elastomeric columnar contact 14 and provides mechanical support for the respective contact. Insulative bridges 22 extend between each intermediate column 20 and at least one adjacent support columns 18 within the respective selected group of support columns 18. The insulative bridges 22 are the by-product of passageways within a mold that allow for molding of the support columns 18 by the injection of fluid insulative material via ports that are located at the respective sites of the intermediate columns 20. The injected insulative material flows through the passageways into the mold areas that define the intermediate columns, the support columns 18 and the bridges 22 and remains in the passageways that define the bridges following the curing of the insulative material.

The columnar contacts 14 are retained within the substrate 12 in a predetermined array and, in one embodiment the support columns 18, the intermediate columns 20 and the bridges 22 are molded as an integral structure out of an insulative polymer, such as silicone.

The insulative substrate 12 includes first and second pluralities of holes arranged in first and second respective hole arrays. Except for holes at the edge of the array, each of the holes in the second plurality of holes is surrounded by holes within the first hole array. The size of the substrate may vary based on the particular application. For example, alignment holes may be provided in the substrate 12 outboard of the first and second pluralities of holes. The contact assembly 16 is formed by molding conductive elastomeric contacts 14 in a predetermined array such that the contacts 14 extend through selected ones of said first plurality of holes and are captively retained within the substrate 12. The conductive elastomeric contacts 14 may be formed via any process known in the art. In the illustrative embodiment, the portion of the columnar contact 14 extending from the substrate 12 is in the form of a frustum with the largest diameter of the frustrum adjacent the substrate 12. It should be appreciated however, that any suitable columnar shape may be employed for the columnar contacts 14.

In a first molding operation, the substrate 12 is inserted into a first mold and a conductive elastomeric material is injected into the mold to form the plurality of integral columnar contacts 14 so that the columnar contacts 14 extend from either side of the substrate 12. The diameter of the contacts 14 at the point at which the contacts abut the substrate 12 is greater than the diameter of the corresponding hole in the substrate 12 through which the columnar contact 14 extends. Consequently, following curing of the conductive elastomeric material to form the conductive contacts 14, the contacts 14 extend outward from opposing sides of the substate 12 and are captively retained within the substrate 12. The first plurality of holes in the substrate 14 may be provided on a first predetermined grid, and the columnar contacts 14 may be molded so as to produce a contact assembly 16 having columnar contacts 14 captively retained in the substrate on the first predetermined grid.

The insulative support columns 18 and the insulative intermediate columns 20 connected by the insulative bridges 22 may be formed as an integral structure in a second molding operation. In the second molding operation, the contact assembly 16 is aligned within a mold and an insulative polymer is injected into the mold at the site of the intermediate columns 20 to form the support columns 18, the intermediate columns 20 and the bridges 22 as a unitary integral structure. The intermediate columns 20 extend through selected ones of the second plurality holes in the substrate 12.

The support columns 18 generally have a cylindrical outer surface, as indicated above, and surround and abut the respective columnar contacts 14. Except for the insulative bridges, the support columns 18 and the intermediate columns are generally free standing cylindrical columnar structures in the illustrated embodiment although other cross-sections may be fabricated. The contacts 14 have opposing contact tips 24 that protrude slightly beyond the respective end surfaces 26 of support columns 18. The support columns 18 provide support for the conductive columnar contacts 14 and resist deformation of the contacts 14 when the connector 10 is mounted between two printed circuit boards or between a printed circuit board and a BGA or LGA device and is subjected to axial compressive forces.

To further resist deformation of the contacts 14, the intermediate columns 20 are formed between groups of support columns 18 and corresponding contacts 14. The opposing ends of the intermediate columns 20 are generally planar and serve as stops that resist compression of the connector in response to the application of excessive axial compressive forces on the columnar contacts 14 and the support columns 18. The outer surface of at least a portion of each intermediate column 20 is spaced equidistant from the outer surfaces of adjacent support columns 18 in one embodiment. Any desired number of intermediate columns 20 may be employed and the intermediate columns 20 may be interspersed within the array of support columns 18.

The intermediate columns 20 extend above and below opposing sides of the substrate 12 and through selected ones of the second plurality of holes in the substrate 12. The intermediate columns 20 have generally planar opposing end surfaces 28 that are spaced from the surface of the respective substrate 12 by a first predetermined distance. The support columns 18 have opposing end surfaces 26 that are spaced from the respective surface of the substrate 12 by a second predetermined distance. The first predetermined distance is less than the second predetermined distance in the presently disclosed embodiment. Accordingly, the intermediate columns 20 serve as stop flanges that effectively limit the amount of vertical compression of the columnar contacts 14 and the support columns 18 that can occur before the surface of the applicable printed circuit board, LGA or BGA device bottoms out on the end surfaces 28 of the intermediate columns 20.

While the tips of the columnar contacts 14 are depicted as being generally planar at the tip ends, the tips may be hemispherical, conical or of any other suitable shape to engage a mating contact pad.

It will be appreciated by those of ordinary skill in the art that modifications to and variations of the above described connectors and methods of producing the same may be made without departing from the inventive concepts disclosed herein. Accordingly, the invention should not be viewed as limited except as by the scope and spirit of the appended claims.

What is claimed is:

1. An electrical connector for conductively coupling electrical contacts on a printed circuit board to electrical contacts on a device, said connector comprising:

an insulating member made of a first material having respective opposite sides and having first and second pluralities of holes therethrough arranged in first and second array patterns;

a plurality of conductive elastomeric members extending through respective ones of said first plurality of holes, each of said conductive elastomeric members having opposite end surfaces disposed beyond said opposite sides of said insulating member; and a plurality of insulative support columns made of a second material that is different than said first material each of said insulative support columns surrounding a respective one of said conductive elastomeric members, each of said insulative support columns having opposite end surfaces disposed in respective planes beyond said opposite sides of said insulating member, but not beyond said conductive elastomeric member end surfaces.

2. The electrical connector of claim 1 wherein said first material is polyimide.

3. The electrical connector of claim 1 wherein each said insulative support column has a generally cylindrical shape.

4. The electrical connector of claim 1 further including intermediate insulative columns each extending through a respective one of said second plurality of holes, each of said intermediate insulative columns having opposite end surfaces disposed beyond said opposite sides of said insulating member but not beyond said support column end surfaces.

5. The electrical connector of claim 4 wherein each of said insulative support columns and said intermediate insulative columns has a generally cylindrical shape.

6. The electrical connector of claim 4 further including at least one insulative bridge extending between one of said intermediate insulative columns and an adjacent one of said insulative support columns, said at least one insulative bridge having end surfaces disposed beyond said opposite sides of said insulating member but not beyond said intermediate insulative column end surfaces.

7. The electrical connector of claim 6 wherein said adjacent one of said insulative support columns, said one intermediate insulative column and said at least one insulative bridges comprise an integral structure.

8. The electrical connector of claim 7 wherein said integral structure is made of silicone.

9. A method for forming a connector comprising:

providing a generally planar substrate made of a first material and having respective opposite sides with a first plurality of holes arranged in a first array pattern and a second plurality of holes arranged in a second array pattern;

molding a first plurality of conductive elastomeric contacts that are captively retained within said first plurality of holes, said elastomeric contacts having opposite end surfaces disposed beyond said opposite sides of said substrate; and molding a plurality of insulative support columns made of a second material that is different than said first material, each of said insulative support columns surrounding a respective one of said elastomeric contacts and having opposite end surfaces that are disposed beyond said opposite sides of said substrate but not beyond said elastomeric contact end surfaces.

10. The method of claim 9 wherein each of said support columns has a generally cylindrical shape.

11. The method of claim 9 wherein said molding of said insulative support columns further includes the step of forming intermediate insulative columns that extends through respective ones of a said second plurality of holes, each of said intermediate insulative columns having opposite end surfaces that are disposed beyond said opposite sides of said substrate but not beyond said support column end surfaces.

12. The method of claim 11 wherein said molding of said insulative support columns further includes the step of forming at least one insulating bridge that extends between one of said intermediate insulative columns and at least one adjacent said support column.

13. The method of claim 11 wherein each of said support columns and said intermediate insulative columns has a generally cylindrical shape.

* * * * *